(12) United States Patent
Ko et al.

(10) Patent No.: US 12,275,233 B2
(45) Date of Patent: Apr. 15, 2025

(54) AUTOMATIC MASK REPLACEMENT DEVICE FOR SCREEN PRINTER

(71) Applicant: ESE CO., LTD., Pyeongtaek-si (KR)

(72) Inventors: Hyung Rae Ko, Incheon (KR); Cheol Hong Myung, Incheon (KR); Young Mi Kim, Incheon (KR)

(73) Assignee: ESE CO., LTD., Pyeongtaek-si (KR)

( * ) Notice: Subject to any disclaimer, the term of this patent is extended or adjusted under 35 U.S.C. 154(b) by 0 days.

(21) Appl. No.: 18/288,639

(22) PCT Filed: Apr. 30, 2021

(86) PCT No.: PCT/KR2021/005502
§ 371 (c)(1),
(2) Date: Oct. 27, 2023

(87) PCT Pub. No.: WO2022/231038
PCT Pub. Date: Nov. 3, 2022

(65) Prior Publication Data
US 2024/0208201 A1 Jun. 27, 2024

(51) Int. Cl.
*B41F 27/00* (2006.01)
*B41F 15/12* (2006.01)
(Continued)

(52) U.S. Cl.
CPC .............. *B41F 15/12* (2013.01); *B41F 15/36* (2013.01); *H05K 3/1225* (2013.01)

(58) Field of Classification Search
CPC ........ B41F 15/12; B41F 15/36; H05K 3/1225
See application file for complete search history.

(56) References Cited

U.S. PATENT DOCUMENTS

2002/0019680 A1  2/2002  Nishikawa et al.
2002/0020346 A1  2/2002  Doyle et al.

FOREIGN PATENT DOCUMENTS

JP        04197684    *  7/1992
JP     2008-114521 A     5/2008
(Continued)

OTHER PUBLICATIONS

International Search Report for PCT/KR2021/005502 dated Jan. 26, 2022 (PCT/ISA/210).
(Continued)

*Primary Examiner* — Christopher E Mahoney
*Assistant Examiner* — Marissa Ferguson-Samreth
(74) *Attorney, Agent, or Firm* — Sughrue Mion, PLLC

(57) ABSTRACT

Provided is an automatic mask replacement device for a screen printer, wherein: a mask that is already installed in a screen printer may be automatically replaced with a new mask, thereby enabling quick switching to the production of a new printed circuit board without unnecessary wasting of time and manpower and without the inconvenience of replacement work, and through the quick switching, providing the advantages of increasing efficiency by increasing productivity and shortening working time; the occurrence of product defects due to replacement work may be minimized in accordance with the rate of change in process conditions being minimized through quick replacement of the mask through an automatic process, rather than an impractical replacement of the mask by manpower; by minimizing a movement distance according to mask replacement, the time required for mask replacement is minimized, thereby enabling quick replacement.

6 Claims, 11 Drawing Sheets

(51) Int. Cl.
      *B41F 15/36*       (2006.01)
      *H05K 3/12*       (2006.01)

(56)       References Cited

FOREIGN PATENT DOCUMENTS

| | | |
|---|---|---|
| JP | 2011-189670 A | 9/2011 |
| KR | 10-2011-0096885 A | 8/2011 |
| KR | 10-1226763 B1 | 2/2013 |
| KR | 20140121250 A * | 1/2014 |
| KR | 10-2014-0121250 A | 10/2014 |
| KR | 10-1517387 B1 | 10/2014 |
| KR | 10-1754853 B1 | 7/2017 |
| KR | 20170134181 A * | 12/2017 |
| KR | 10-2266113 B1 | 6/2021 |

OTHER PUBLICATIONS

Official Communication (Extended European Search Report) dated Aug. 28, 2024 for European Patent Application No. 21939421.0.

* cited by examiner

AUTOMATIC MASK REPLACEMENT DEVICE FOR SCREEN PRINTER

CROSS REFERENCE TO RELATED APPLICATIONS

This application is a National Stage of International Application No. PCT/KR2021/005502 filed Apr. 30, 2021.

TECHNICAL FIELD

The present disclosure relates to an automatic mask replacement apparatus for a screen printer. More specifically, the present disclosure relates to an automatic mask replacement apparatus for a screen printer in which when producing a printed circuit board with a pattern printed on a mask in a screen printer, an old mask is automatically replaced with a new mask in response to production of a new printed circuit board, such that a mask setting time due to manual operation may be significantly reduced, thereby quickly switching to production of a new printed circuit board without inconvenience of the replacement work due to unnecessary manpower, and thus not only improving productivity and increases efficiency via reduction of a working time, but also minimizing change in a process condition via quick replacement in an automatic process rather than unreasonable replacement, thereby minimizing occurrence of product defects due to the replacement work, and reducing a restriction on a facility area when constructing a facility line.

BACKGROUND ART

A printed circuit board (PCB) is any electronic circuit board (a board made of resin such as phenol or epoxy on which an electrical wiring, semiconductors, and passive components are integrated) included in an electronic device that is indispensable in modern life, such as home appliances. The electronic device continues to develop, and currently, the representative products thereof are mobile phones, computers, and portable netbooks.

As may be seen from the development of these products, the diversification of functions according to consumer needs continues, and new products are being released every day. Such developments are aimed at increasing circuit density and miniaturization.

A surface mounted device (SMD) is mounted on the printed circuit board. This surface mount device is a general term of electronic components mounted on a surface of the printed circuit board, and different components may be mounted on the printed circuit board using surface mount technology (SMT).

However, before mounting these components thereon, solder printing should be made to print a printed circuit pattern for mounting the components on the printed circuit board. The solder printing is performed using a screen print apparatus.

When solder-printing the printed circuit pattern for mounting the surface mount components on the printed circuit board, a backup jig is required to support the printed circuit board in a center conveyor device. A print pattern of a mask is printed on the printed circuit board via the solder printing. At this time, the backup jig is used to prevent the printed circuit board from being bent at a position which a squeegee for pushing and printing the solder contacts the PCB due to a pressing force of the squeegee for pushing and printing the solder.

Therefore, for the solder printing of the printed circuit board, the mask and the backup jig are essential components. When a size and a pattern of the printed circuit board that has been already produced changes, the mask and the backup jig are replaced with new ones. The replacements of the mask and the backup jig are usually done manually, and separately, thereby lowering overall production efficiency due to unnecessary waste of manpower and increased replacement work time.

Moreover, in the process of replacing the mask and the backup jig, not only the replacement time increases, but also change in a work process condition is large, and thus immediate replacement was not possible such that the product defect significantly increases.

In other words, when replacing the mask and the backup jig through manual operation, the mask and the backup jig should be setup for the printed circuit board. The setup time is approximately 15 to 40 minutes for mask replacement, depending on skill level, and the continuity of work is reduced due to an additional time required to replace the backup jig. Furthermore, this replacement time not only increases a production time and reduces productivity, but also reduces overall work efficiency.

To solve this problem, a screen printer capable of automatically replacing the mask and the backup jig has been recently introduced. The screen printer capable of automatic mask replacement is disclosed as follows. Korea Patent Application Publication No. 10-2011-0096885 discloses an apparatus for replacing a board support module for a screen printer. Korean Patent No. 10-1517387 assigned to the present applicant discloses an apparatus for automatically replacing the backup jig and the mask simultaneously in response to replacement of the printed circuit board of a screen printer, and a method for automatically replacing the backup jig and the mask using the same.

In Korea Patent Application Publication No. 10-2011-0096885, the automatic mask replacement apparatus is provided with a loading part where substrate support modules of printing jobs are independently loaded into slots, and the substrate support module of each printing job accommodated in the loading part is replaced in the X direction according to a signal. Such a conventional automatic mask replacement apparatus always deals with a mask of a certain size, and cannot be applied to a case in which a size of the mask suitable for the printed circuit board varies, and simply loads and inserts the mask. Moreover, in the configuration thereof, a transfer unit and the loading unit are arranged along the X direction, and are separate from each other, thereby causing constriction in terms of an area. Therefore, it is quite difficult to add the automatic mask replacement apparatus to an entire process line that has already been constructed, and general-purpose use thereof is not possible.

Further, in Korean Patent No. 10-1517387 assigned to the present applicant, in order to solve the above-mentioned problem, the apparatus for automatically replacing the backup jig and the mask simultaneously is formed integrally with the printed circuit board and performs automatic mask insertion therein. However, in this patent assigned to the present applicant, the apparatus moves in the Z-axis line and the input of the mask is performed in the X-axis line. Thus, a dimension in the Y-axis direction is minimum. However, a total width increases, thereby causing constriction in terms of an installation area. This problem is the same as that of Korea Patent Application Publication No. 10-2011-0096885.

Furthermore, the overall replacement time is increased due to the limitation of a time to immediately respond to a varying size of the new mask corresponding to the printed circuit board to be replaced. In other words, a width of the mask is adjusted according to the forward and backward movement of the ball screw in one direction, which increases the mask width adjustment time. An accuracy at which the apparatus deals with the mask width is lower than when adjusting the left and right sides simultaneously.

Moreover, while the width has been adjusted, the component of the apparatus moves in the Z-axis direction, and then in the X-axis direction for the mask replacement process. That is, the component of the apparatus turns the direction rightly. This may cause an error in the mask input. Thus, the setting should be re-performed, resulting in an unnecessary process or print error.

In other words, the entire process of moving the mask for replacement takes a lot of time, which increases the mask replacement time. As the width of the entire mask replacement apparatus increases due to movement in the Z-axis direction, there is a problem of requiring a large space area.

Furthermore, even in the automatic replacement process of the backup jig, a separate fixed conveyor is installed at a block coupling unit for combining the backup jig thereto and between the block coupling unit and the backup jig demand and supply means for automatic replacement of the backup jig. Thus, a vertical width between the mask installed part and the backup jig remains fixed. Therefore, in the backup jig input during the entire process, the distance between the fixed conveyors for replacement of the backup jig to the block joint through the backup jig demand and supply means that accommodates the backup jig is always fixed, and thus it is difficult to limit the reduction of the X-axis length for backup jig replacement, and it is difficult to adjust the spatial distance between the part where the mask is installed and the block joint.

In other words, when the mask is mounted on one side of a printed circuit board for producing home appliances, its thickness may be expanded. In other words, in the case of a printed circuit board whose both sides are used, while the mask is mounted on one side, another mask is put on the other side, there is restriction on the distance between the mask and the block joint corresponding to the thickness input using only the existing printed circuit board, and this may make printing impossible, so efforts are needed to further expand the distance.

PRIOR ART LITERATURE

Patent Document

1) Korean Patent Application Publication No. 10-2011-0096885, published on Aug. 31, 2011.
2) Korean Patent No. 10-1517387, registration date: Apr. 28, 2015.

DISCLOSURE

Technical Problem

Therefore, the present disclosure has been devised to solve the problems described above. Thus, a purpose of the present disclosure is to provide an automatic mask replacement apparatus for a screen printer, wherein a mask that is already installed in a screen printer may be automatically replaced with a new mask, thereby enabling quick switching to the production of a new printed circuit board without unnecessary wasting of time and manpower and without the inconvenience of replacement work, and through the quick switching, providing the advantages of increasing efficiency by increasing productivity and shortening working time.

Further, a purpose of the present disclosure is to provide an automatic mask replacement apparatus for a screen printer, wherein change in a process condition may be minimized via quick replacement in an automatic process rather than unreasonable replacement, thereby minimizing occurrence of product defects due to the replacement work, and further, a movement distance according to mask replacement may be minimized such that the time required for mask replacement is minimized, thereby enabling quick replacement; and the installed old mask and the new mask are arranged vertically, thereby reducing the size of the apparatus to reduce restriction on the installation area thereof.

Technical Solution

In order to achieve the above purpose, an automatic mask replacement apparatus for a screen printer S according to the present disclosure is coupled to one side of a printing area P of the screen printer S and automatically replaces a mask M mounted on a top of the printing area, wherein the automatic mask replacement apparatus comprises: a base plate 100 having both guide rails 110 installed on an upper surface thereof and extending in an elongate manner in a front-to-back longitudinal direction, wherein the both guide rails 110 are arranged symmetrically in a left and right direction and are disposed on top of the printing area of the screen printer; a pull and push unit 200 coupled to the guide rails 110 of the base plate 100 and configured to move back and forth along the guide rails under an operation of a pull and push drive motor so as to push and discharge a mask M already installed on the printing area P of the screen printer S and to pull and insert a new mask NM to be mounted onto the printing area P of the screen printer S; both mask supply and collection units 300 symmetrically formed in a left and right direction so as to face each other and respectively disposed at opposing inner left and right surfaces of the base plate 100, wherein each of the both mask supply and collection units 300 has an upper support plate extending to the printing area of the screen printer in an elongate manner in a front-to-back longitudinal direction, wherein each of left and right ends of the new mask NM is caught and supported on an upper surface of the upper support plate, wherein the each of the both mask supply and collection units 300 has a lower support plate positioned directly under the upper support plate and extending in an elongate manner in ta front and rear direction from the printing area of the screen printer to a position where the mask M is discharged and collected, wherein each of left and right ends of the already installed mask M being discharged is caught and supported on an upper surface of the lower support plate; and both vertically-moving units 400 arranged symmetrically formed in the right and left direction so as to face each other and positioned in front of the mask supply and collection unit 300 and inwardly of the base plate 100, wherein the mask M already installed on the printing area and caught and supported on the lower support plate of the mask supply and collection unit 300 is pushed on and along the lower support plate to a discharge collection position under an operation of the pull and push unit 200, and then, the new mask NM to be mounted into the printing area supplied from the upper support plate is pulled and positioned to the printing area under an operation of the pull and push unit, and then each of the vertically-moving unit 400 moves down the new mask NM on the lower support plate such that each of both left and right ends of the new mask NM are caught and supported on the lower support plate and positioned on the printing area.

In this regard, the pull and push unit 200 includes: each of both movable vertical-shaped pieces 210 having a rail block 212 disposed at a low end thereof such that the rail block 212 is rail-coupled to each of the guide rails 110 of the base plate 100; a plate-shaped bridge bar 220 having both opposing ends, wherein each of the movable vertical-shaped pieces 110 is coupled to a lower side of each of the both opposing ends of the plate-shaped bridge bar 220, wherein when the plate-shaped bridge bar 220 move in a back and forth direction of the base plate, the movable vertical-shaped piece coupled thereto moves in the back and forth direction along the guide rail; a pull and push means 230 disposed at a center of the bridge bar 220, and including a pull cylinder 232 configured to pull the new mask NM toward the printing area and a push cylinder 234 configured to push the mask M already installed in the printing area so that the mask M is discharged and collected; a pull and push drive motor 240 coupled to one side of an upper surface of the base plate 100 and having a screw shaft 242 extending along an axis of a motor shaft in the front and rear longitudinal direction in an elongate manner to the printing area; and a screw housing 250 coupled to an outer side of one of the both movable vertical-shaped pieces 210, and screw-coupled to the screw shaft 242 of the pull and push drive motor 240 so as to convert a rotation motion of the screw shaft into a linear motion so that each of the movable vertical-shaped pieces 210 moves back and forth on the guide rail 110.

In one implementation, each of the both mask supply and collection units 300 includes: a supply and collection body 310 formed as a rectangular plate body extending in an elongate manner in a front and rear longitudinal direction from one end where the mask is supplied and discharged to the printing area, wherein a pair of block holes 312 are formed in a lower portion of a side of an area of the body 310 overlapping the printing area, wherein an idler hole 314 is formed in a lower portion of a side of an area of the body 310 disposed between the block holes 312; the upper support plate 320 disposed on an upper level of an inner side surface of the supply and collection body 310 and extending in an elongate manner in the front-to-back longitudinal direction until the idler hole before the printing area of the screen printer, wherein each of both left and right ends of the new mask NM is caught and supported on an upper surface of the upper support plate 320; the lower support plate 330 disposed on a lower level of the inner side surface of the supply and collection body 310 and directly positioned under the upper support plate 320, and extending in an elongate manner in the front and rear longitudinal direction from the printing area of the screen printer to the position where the mask is discharged and collected so that each of both left and right ends of the already installed mask M to be discharged are caught and supported on an upper surface thereof; a holding unit 340 retractable into or extendable from the block hole 312 of the supply and collection body 310 so as to contact or non-contact each of inner sides of the supply and collection bodies facing each other, wherein the holding unit 340 is disposed at at least one of the both opposing collection bodies so as to press and fix each of left and right edges of the new mask NM having moved downwardly from the upper support plate to the lower support plate and then mounted on the printing area under an operation of the vertically-moving unit 400 to prevent horizontal movement of the new mask NM; and an idler unit 350 retractable into or extendable from the idler hole 314 of the supply and collection body 310, wherein when the new mask NM is displaced from the upper support plate 320 to the printing area under the operation of the pull and push unit 200, the idler unit 350 is configured to extend from the idler hole 314 inwardly of the inner side of the body 310 such that the new mask is supported on the idler unit 350 at a point beyond the upper support plate, and then the new mask is moved, wherein when the new mask NM is displaced downward toward the lower support plate 330 under the operation of the vertically-moving unit 400, the idler unit 350 is configured to be retractable into the idler hole 314 to prevent interference with the new mask NM.

In this regard, the holding unit 340 includes: a rectangular pressing block 342 retractable into or extendable from the block hole 312 of the supply and collection body 310 so as to be contact or non-contact each of the inner sides of the supply and collection bodies facing each other; and a pressing cylinder 344 coupled to each of outer sides of the supply and collection bodies 310 facing each other, so that a rod thereof is coupled to the pressing block 342, wherein as the rod horizontally moves, the pressing block 342 moves horizontally so as to be retractable into or extendable from the block hole 312. The idler unit 350 includes: a plurality of idlers 352 respectively coupled to shafts so as to freely roll around the shafts; a shaft block 354 to which the shafts coupled to plurality of idlers 352 are coupled; and a support cylinder 356 having a rod coupled to the shaft block 354 to which the plurality of idlers are coupled, wherein as the rod moves, the plurality of idlers are moved horizontally so as to be retractable into or extendable from the idler hole 314.

In one implementation, each of the vertically-moving units 400 includes: a fixing bracket 410 coupled to each of both opposing sides of the base plate 100 facing each other, and bent into an "L" shape so that a cylinder is seated thereon and coupled thereto; a vertically-moving cylinder 420 having a movable vertically rod, where the vertically-moving cylinder 420 is seated on a horizontal surface of a bent portion of the fixing bracket 410; a vertically-moving fixing piece 430 formed as a "inverted-T" shaped plate body, wherein fixing bolt holes 432 are formed therein and are positioned symmetrically in the left and right direction, wherein a rod fixing hole 434 to which the rod of the vertically-moving cylinder 420 is coupled is formed in a surface of a plate protruding from a portion between the fixing bolt holes 432; an elevating portion 440 moving independently in an area of the mask supply and collection unit 300 outside an end of the printing area under the operation of the vertically-moving cylinder 420, wherein the elevating portion 440 moves up such that a vertical level thereof is equal to a vertical level of the upper support plate 320 such that the mask is supported on the elevating portion 440 and the upper support plate 320, wherein the elevating portion 440 moves down such that the vertical level thereof is equal to a vertical level of the lower support plate 330 such that the mask is supported on the elevating portion 440 and the lower support plate 330; and a connecting shaft 450 having an upper end fixedly coupled to the fixing bolt hole 432 of the vertically-moving fixing piece 430, and a lower end coupled to a top of the elevating portion 440, so that the elevating portion moves vertically under the operation of the vertically-moving cylinder 420 and thus, the mask placed thereon is displaced to the lower support plate 330.

Further, the automatic mask replacement apparatus further comprises a spacing-adjustment cylinder 500 disposed on an upper side of each of the mask supply and collection unit 300 and the vertically-moving unit 400 to prevent upward lifting and horizontal movement for the vertical movement of the new mask NM pulled and supplied under the operation of the pull and push unit 200, wherein the spacing-adjustment cylinder 500 is configured to perform spacing-adjustment during movement according to a height of the mask frame to prevent tilting of the mask when positioning the mask onto the printing area of the mask.

Technical Effect

The present disclosure may provide the automatic mask replacement apparatus for a screen printer, wherein a mask that is already installed in a screen printer may be automatically replaced with a new mask, thereby enabling quick switching to the production of a new printed circuit board without unnecessary wasting of time and manpower and without the inconvenience of replacement work, and through the quick switching, providing the advantages of increasing efficiency by increasing productivity and shortening working time. Further, the present disclosure may provide the automatic mask replacement apparatus for a screen printer, wherein change in a process condition may be minimized via quick replacement in an automatic process rather than unreasonable replacement, thereby minimizing occurrence of product defects due to the replacement work, and further, a movement distance according to mask replacement may be minimized such that the time required for mask replacement is minimized, thereby enabling quick replacement; and the installed old mask and the new mask are arranged vertically, thereby reducing the size of the apparatus to reduce restriction on the installation area thereof.

BEST MODE

Figure 1:
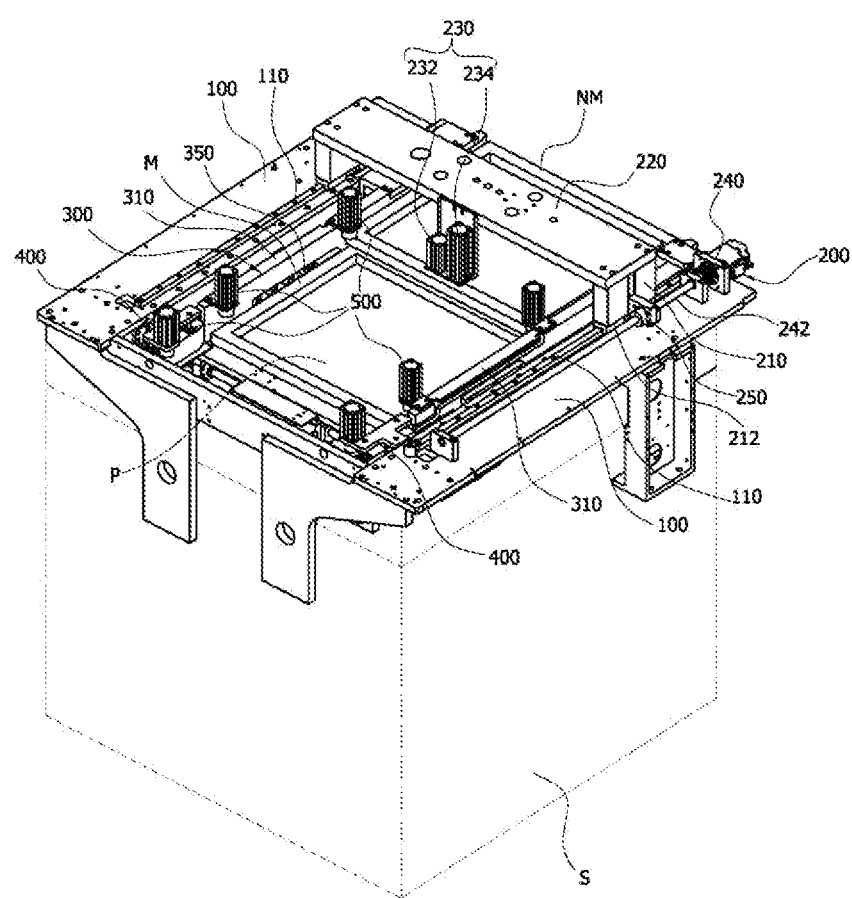
FIG. 1 is an overall perspective view of an automatic mask replacement apparatus for a screen printer according to the present disclosure.

The advantages and features of the present disclosure, and a method to achieve them will become clear with referring to embodiments as described in detail below along with the accompanying drawings. However, the present disclosure is not limited to the embodiments as disclosed below and will be implemented in a number of different forms.

In this specification, this embodiment is provided to ensure that the present disclosure is complete and to fully inform those skilled in the art of the present disclosure of the scope of the present disclosure. The present disclosure is defined only by the scope of the claims. Accordingly, in some embodiments, well-known components, well-known operations, and well-known techniques are not specifically described to avoid ambiguous interpretation of the present disclosure.

Like reference numerals refer to like elements throughout the specification. Additionally, the terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "include", and "including" when used in this specification, specify the presence of the stated features, integers, operations, elements, and/or components, but do not preclude the presence or addition of one or more other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an embodiment of an automatic mask replacement apparatus for a screen printer according to the present disclosure will be described in detail with reference to the attached drawings.

Figure 2:
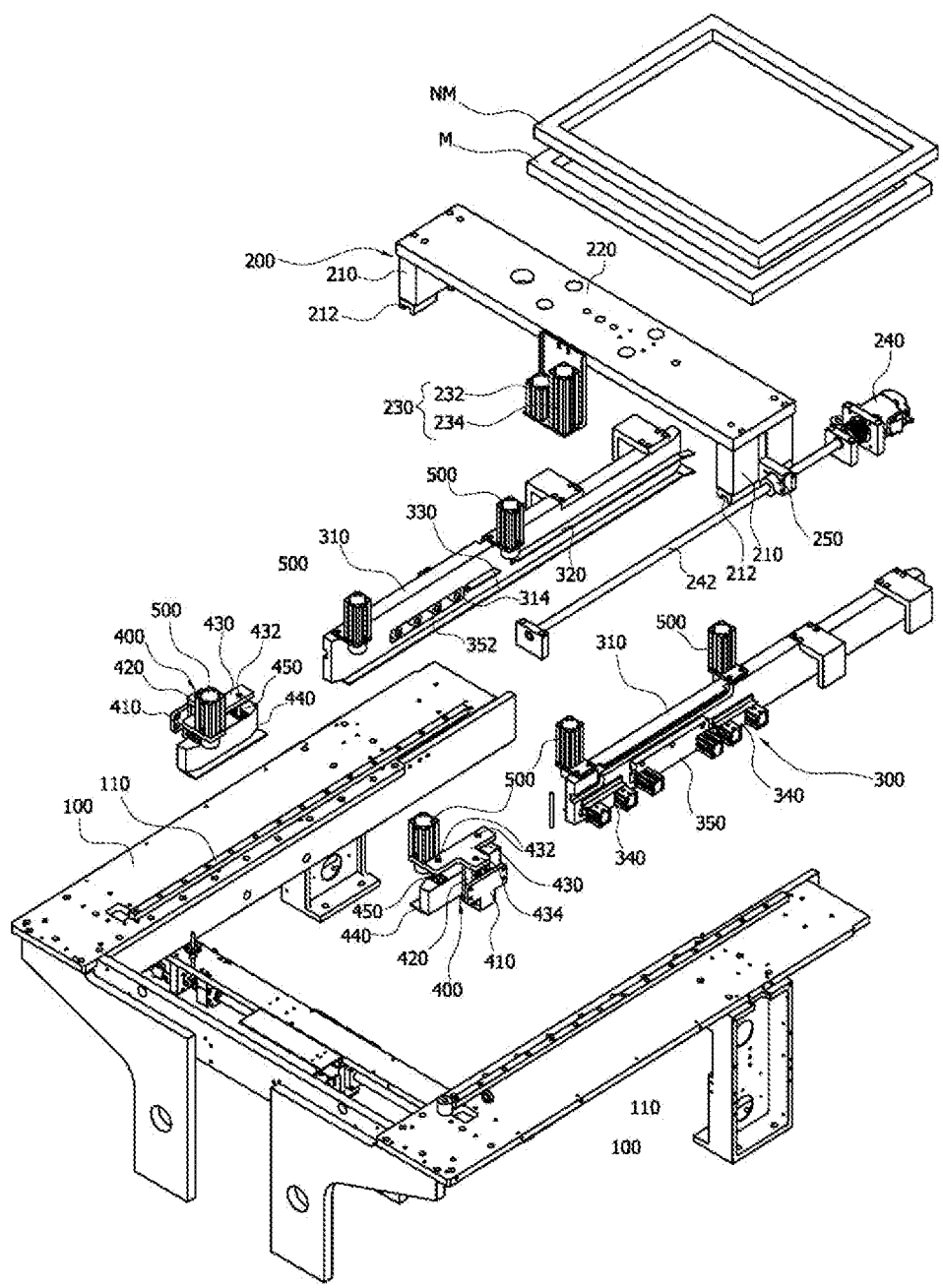
FIG. 2 is an exploded perspective view of an automatic mask replacement apparatus for a screen printer according to the present disclosure.
Figure 3:
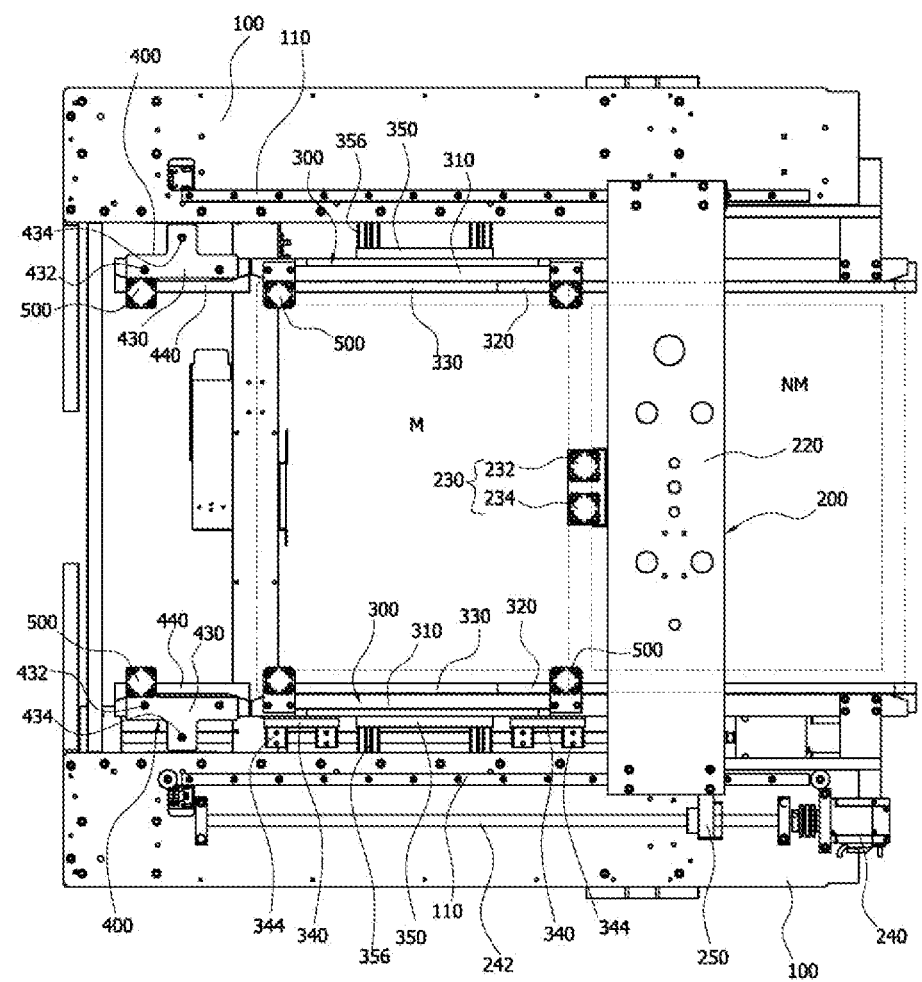
FIG. 3 is a plan view of an automatic mask replacement apparatus for a screen printer according to the present disclosure.
Figure 4:
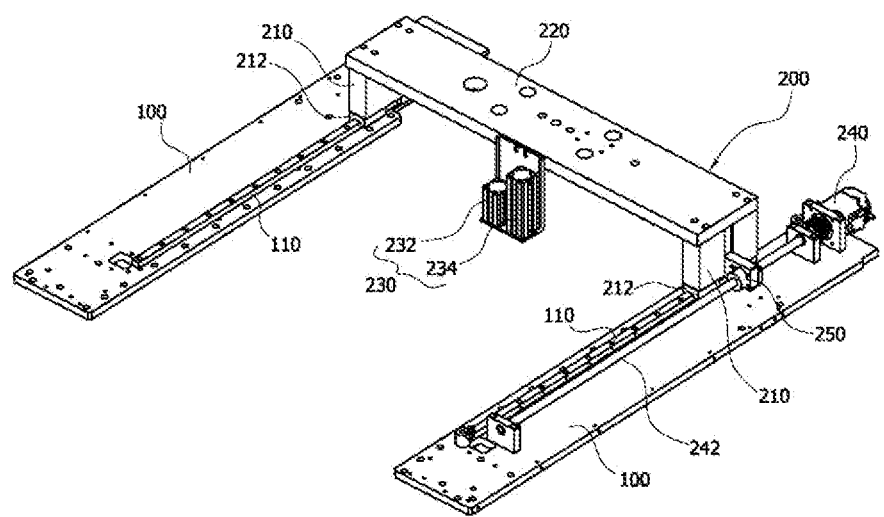
FIG. 4 is a perspective view of a main part of a pull and push unit of an automatic mask replacement apparatus for a screen printer according to the present disclosure.
Figure 5:
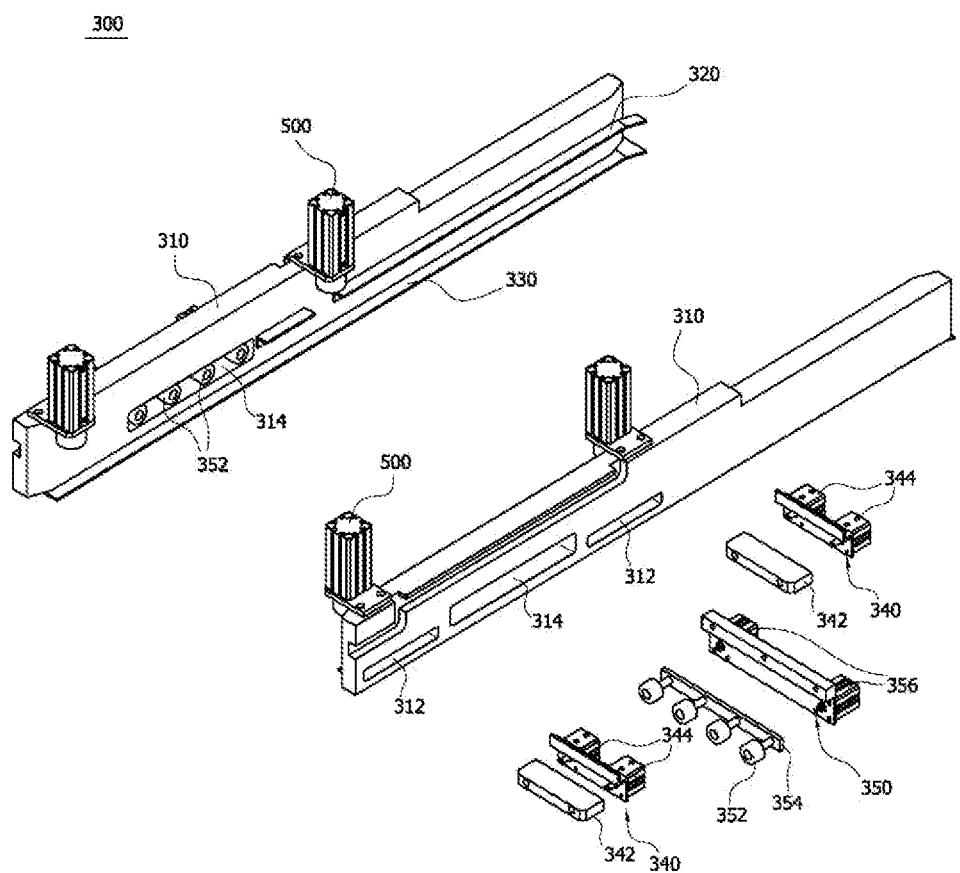
FIG. 5 is a schematic perspective view of a mask supply and collection unit of an automatic mask replacement apparatus for a screen printer according to the present disclosure.
Figure 6:
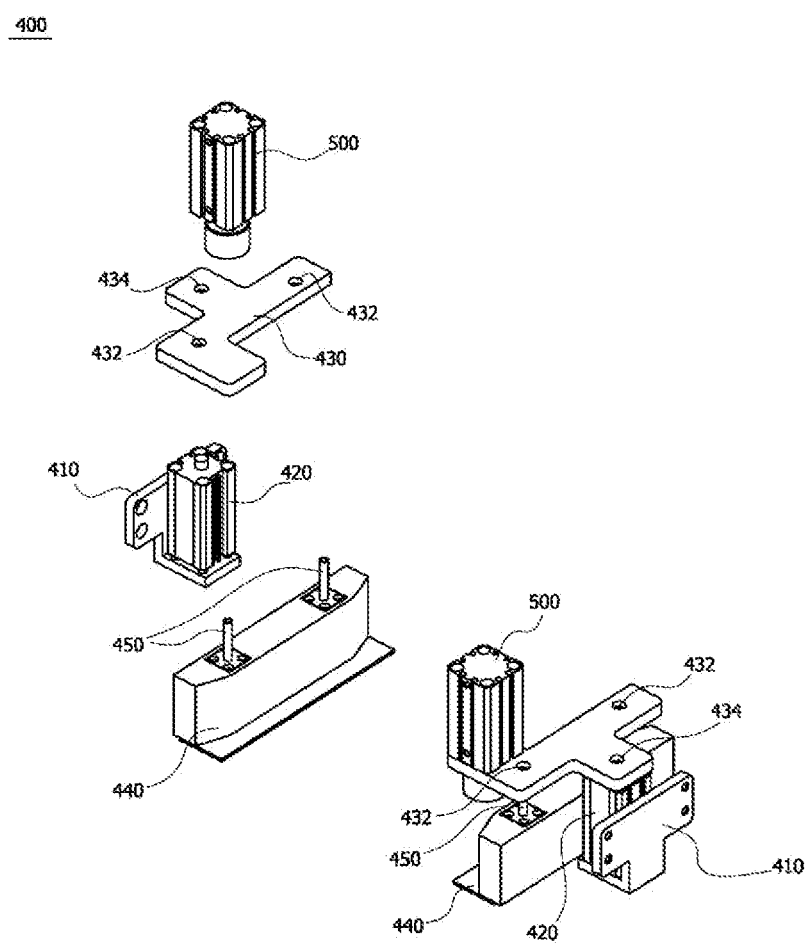
FIG. 6 is a schematic perspective view of a vertically-moving unit of an automatic mask replacement apparatus for a screen printer according to the present disclosure.
Figure 7:
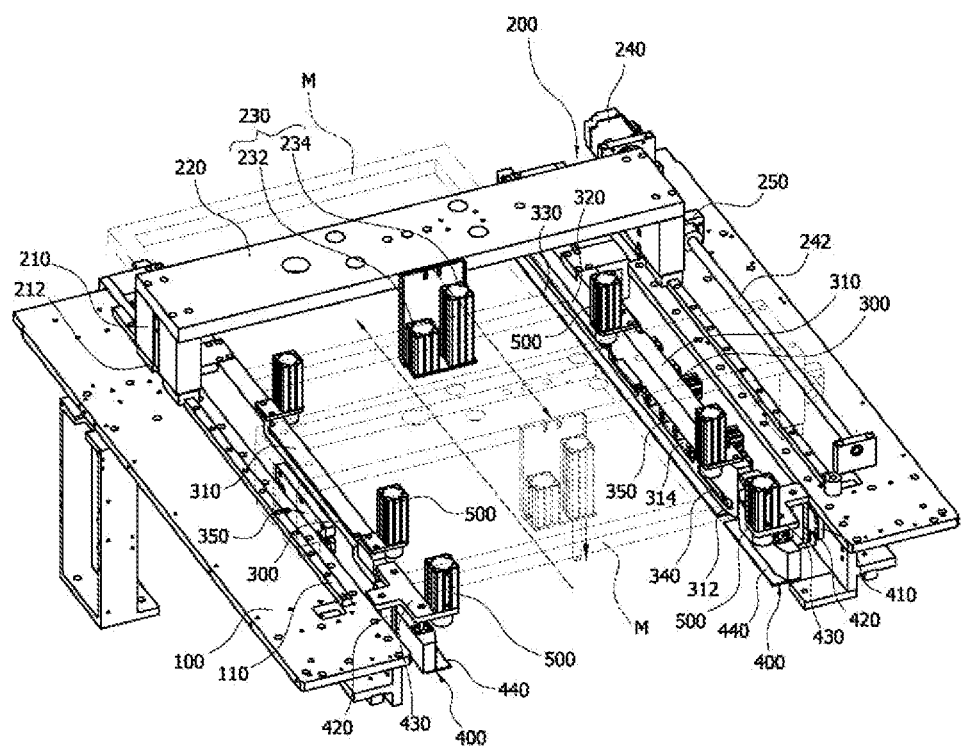
FIG. 7 is a perspective view of a main part of an operating state for discharge and collection of an already installed mask of an automatic mask replacement apparatus for a screen printer according to the present disclosure.
Figure 8:
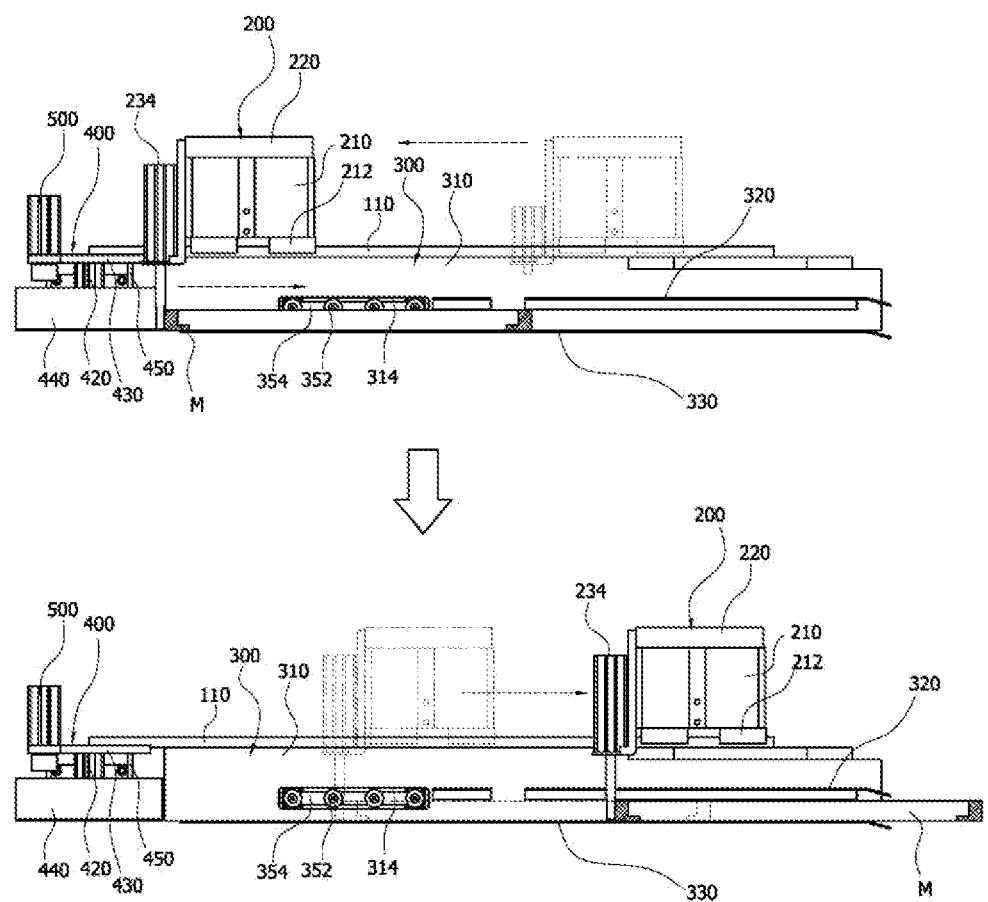
FIG. 8 is a side view of a main part of an operating state for discharge and collection of an already installed mask of an automatic mask replacement apparatus for a screen printer according to the present disclosure.
Figure 9:
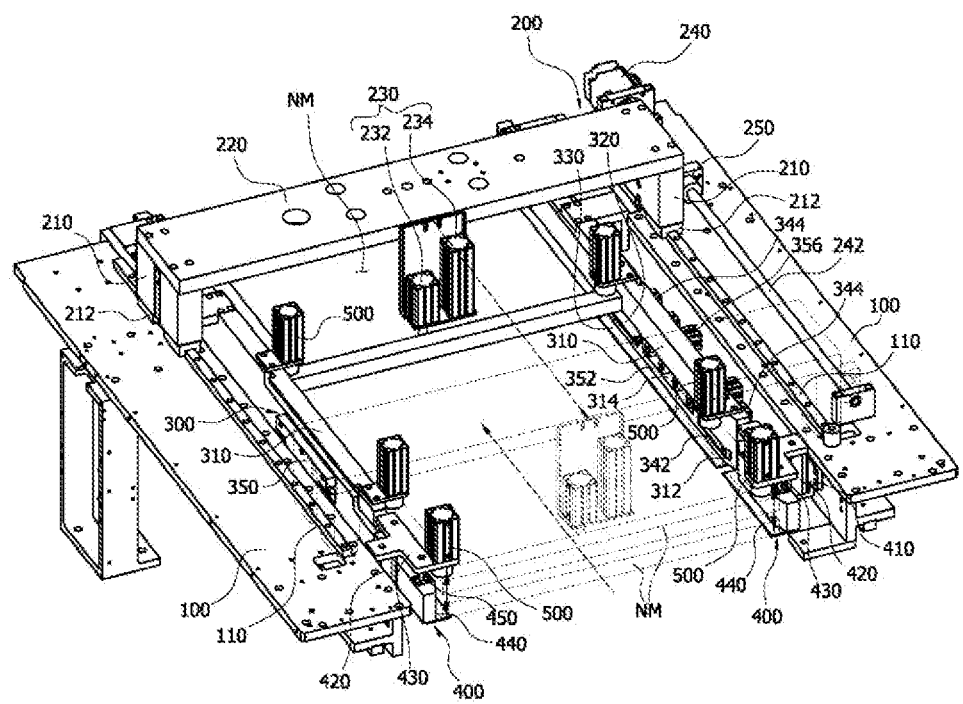
FIG. 9 is a perspective view of a main part of an operating state for installing a new mask on a printing area of an automatic mask replacement apparatus for a screen printer according to the present disclosure.
Figure 10:
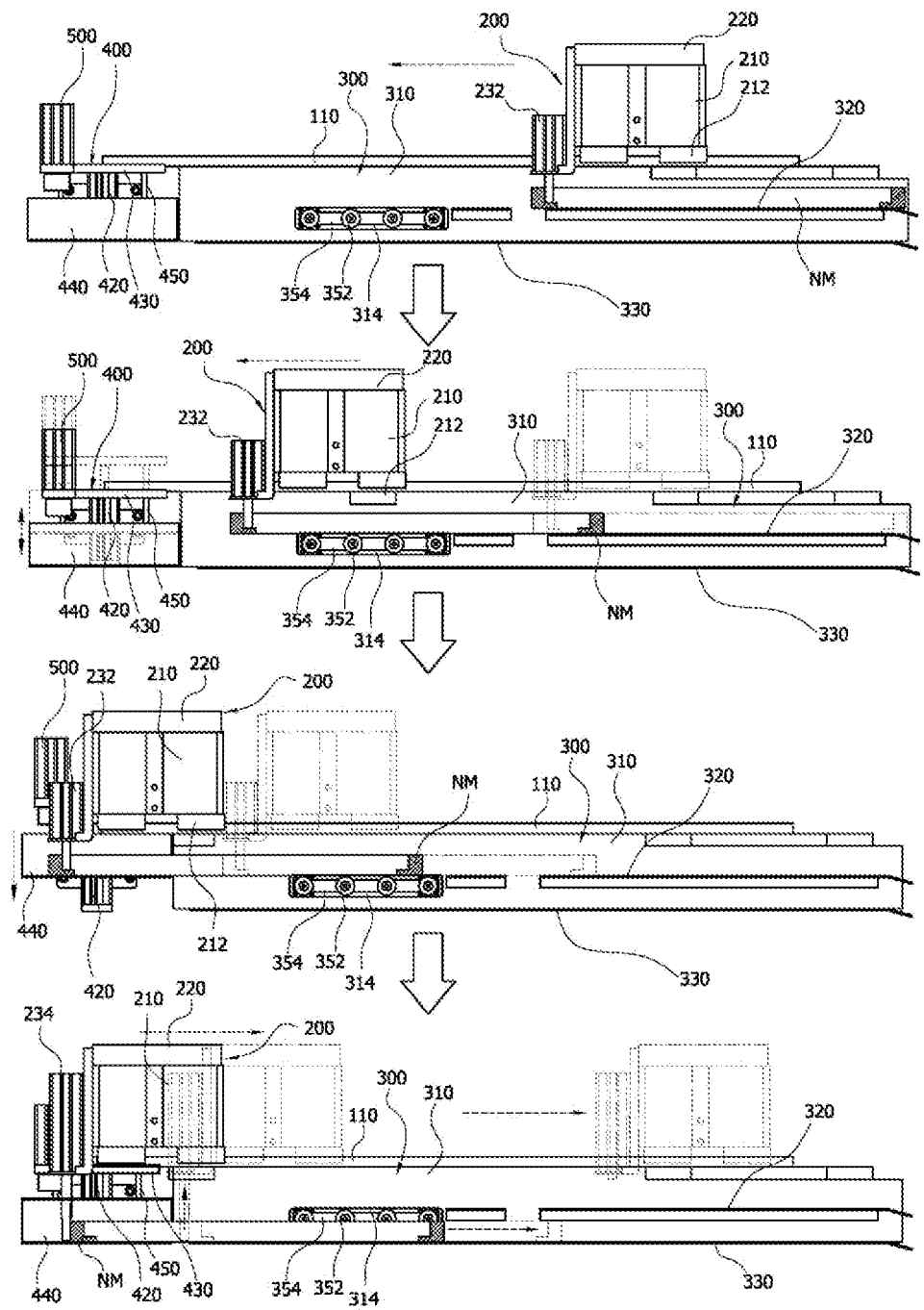
FIG. 10 is a side view of a main part of an operating state for installing a new mask on a printing area of an automatic mask replacement apparatus for a screen printer according to the present disclosure.
Figure 11:
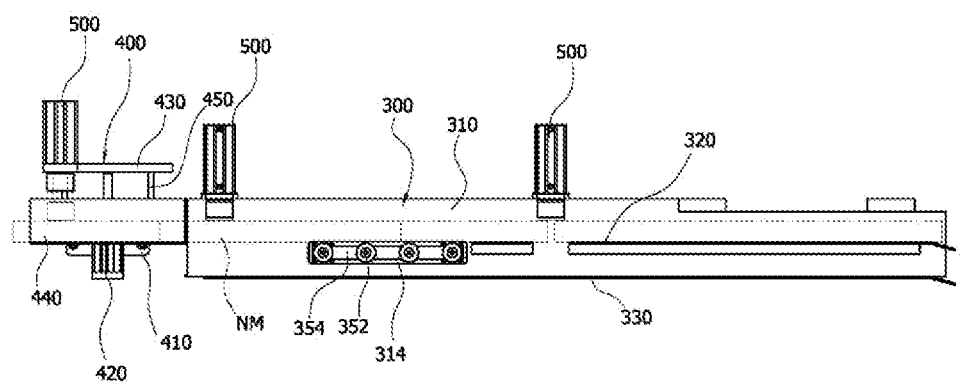
FIG. 11 is a side view of an operating state of a mask by a spacing-adjustment cylinder of an automatic mask replacement apparatus for a screen printer according to the present disclosure.

FIG. 1 is an overall perspective view of an automatic mask replacement apparatus for a screen printer according to the present disclosure. FIG. 2 is an exploded perspective view of an automatic mask replacement apparatus for a screen printer according to the present disclosure. FIG. 3 is a plan view of an automatic mask replacement apparatus for a screen printer according to the present disclosure. FIG. 4 is a perspective view of a main part of a pull and push unit of an automatic mask replacement apparatus for a screen printer according to the present disclosure. FIG. 5 is a schematic perspective view of a mask supply and collection unit of an automatic mask replacement apparatus for a screen printer according to the present disclosure. FIG. 6 is a schematic perspective view of a vertically-moving unit of an automatic mask replacement apparatus for a screen printer according to the present disclosure. FIG. 7 is a perspective view of a main part of an operating state for discharge and collection of an already installed mask of an automatic mask replacement apparatus for a screen printer according to the present disclosure. FIG. 8 is a side view of a main part of an operating state for discharge and collection of an already installed mask of an automatic mask replacement apparatus for a screen printer according to the present disclosure. FIG. 9 is a perspective view of a main part of an operating state for installing a new mask on a printing area of an automatic mask replacement apparatus for a screen printer according to the present disclosure. FIG. 10 is a side view of a main part of an operating state for installing a new mask on a printing area of an automatic mask replacement apparatus for a screen printer according to the present disclosure. FIG. 11 is a side view of an operating state of a mask by a spacing-adjustment cylinder of an automatic mask replacement apparatus for a screen printer according to the present disclosure.

The automatic mask replacement apparatus for a screen printer according to the present disclosure has been devised to replace an initial mask with a new mask different therefrom to print a pattern of the new mask while printing a pattern of the initial mask in a process of printing the pattern of the printed circuit board using the screen printer. The automatic mask replacement apparatus for a screen printer according to the present disclosure is designed to automatically replace the mask of a screen printer suitable for the production of a new printed circuit board quickly and precisely while minimizing restriction on the installation area thereof.

Therefore, it is possible to quickly transition to the production of a new printed circuit board without unnecessary waste of time and manpower in the process of replacing the mask and the hassle of replacement work, thereby shortening the overall process time, thereby increasing efficiency through improved productivity and reduced working time, and the change in process conditions may be minimized through rapid replacement of the screen printer's mask through an automatic process rather than an unreasonable replacement by manpower, such that the occurrence of product defects due to replacement work may be minimized, and horizontal collection and supply of the mask may be achieved, and the mask may be moved vertically so that the mask is accurately positioned and installed on the printing area of the screen printer, thereby achieving fast and accurate mask replacement. Since the apparatus is installed on top of the printing area of the screen printer, such that a separate installation area thereof is not required, and thus restriction on the installation area thereof is removed. The automatic mask replacement apparatus according to the present disclosure is coupled to the upper side of the printing area of the screen printer and is configured to automatically replace the mask M disposed the top of the printing area includes a base plate 100, a pull and push unit 200, a mask supply and collection unit 300, and a vertically-moving unit 400 as shown in FIGS. 1 to 3.

The base plate 100 is formed by combining a plurality of frames to each other. The pull and push unit 200, the mask supply and collection unit 300, and the vertically-moving unit 400, which will be described later may be mounted on the base plate 100. A guide rail 110 is formed on the upper surface thereof and extends in an elongate manner in the front-to-back longitudinal direction. Two guide rails 110 are disposed on top of the printing area of the screen printer and are disposed at the left and right sides respectively in a symmetrical manner. As the base plate 100 is installed on top of the printing area of the screen printer, there is no need for an additional installation area on which the apparatus for replacing the mask is to be installed, so that there is no restriction on the installation area thereof. In other words, the base plate is formed symmetrically in a left and right direction such that one side of the base plate is the collection point of the mask and is positioned at a position that vertically overlaps the screen printer, and the other side thereof is positioned directly on top of the printing area of the screen printer.

The pull and push unit 200 is rail-coupled to the guide rail 110 of the base plate 100 and is configured to move back and forth along the rail under an operation of a pull and push drive motor so as to push and discharge the mask M already installed on the printing area P of the screen printer S, and to pull and mount the new mask NM on the printing area P of the screen printer S. In this regard, when the pull and push unit 200 moves along the guide rail, it advances to a position for transferring the mask to the printing area of the screen printer, and moves along the rail to a point where the pull and push unit 200 discharges the mask such that the discharged mask may be collected by other collection devices or by an automatic or manual collection system.

As shown in FIGS. 1 to 4, the pull and push unit 200 includes a movable vertical-shaped piece 210, a bridge bar 220, a pull and push means 230, and a pull and push drive motor 240, and a screw housing 250.

The movable vertical-shaped piece 210 moves on the guide rail upon receiving the driving force of the pull and push drive motor, which will be described later. The movable vertical-shaped piece 210 has a bottom coupled to a rail block 212 that is rail-connected to the guide rail 110 of the base plate 100. In this regard, the screw housing 250 as described later is coupled to one of the movable vertical-shaped pieces 210, that is, one of the movable vertical-shaped piece 210 coupled to the pull and push drive motor, and changes a rotational motion of a screw shaft to linear motion such that the screw housing moves on the guide rail. The screw housing 250 is connected to the opposite movable vertical-shaped pieces 210 which face each other and are formed in a symmetrical manner with each other via the bridge bar 220, which will be described later, so that the opposite movable vertical-shaped pieces 210 and the screw housing 250 may be moved simultaneously.

The bridge bar 220 is provided so that he opposite movable vertical-shaped pieces 210 which face each other and are formed in a symmetrical manner with each other via the bridge bar 220 may move simultaneously on the guide rail. Both movable vertical-shaped pieces 210 are respectively coupled to the lower sides of both ends of the bridge bar 220. The bridge bar 220 is provided in a plate shape so that both the movable vertical-shaped pieces coupled thereto moves back and forth on the base plate along the guide rail.

The pull and push means 230 may pull and push a new mask NM to be mounted and the already installed mask M while the movable vertical-shaped pieces 210 at both ends by the bridge bar 220 move back and forth under a driving force of the pull and push drive motor, which will be described later. The pull and push means 230 includes a pull cylinder 232 at the center of the bridge bar 220 to pull the new mask NM toward the printing area, and a push cylinder 234 to push the mask M already installed in the printing area so as to be discharged and collected. In this regard, a rod of the pull cylinder is caught with an inner face of an edge of the new mask to be mounted to pull the mask toward the printing area of the screen printer, and an end of a rod of the push cylinder is engaged with an outside side of the edge of the mask to push the mask.

The pull and push drive motor 240 may generate a driving force such that the bridge bar 220 having the pull and push means 230 disposed in the center thereof and the movable vertical-shaped pieces 110 respectively coupled to the both ends thereof moves back and forth on the guide rail 110 of the base plate 100. The pull and push drive motor 240 has a screw shaft 242 coupled to one side of the upper surface of the base plate 100, and extending along the axis of a motor shaft extending in an elongate manner in the front and rear longitudinal direction to the printing area.

The screw housing 250 changes the rotational movement of the above-described screw shaft 242 into the linear movement, and is disposed on the outside of one of the movable vertical-shaped pieces 210, and is screw-coupled to the screw shaft 242 of the pull and push drive motor 240 and converts the rotational force of the rotating screw shaft into linear motion. Thus, the movable vertical-shaped pieces 210 move back and forth on the guide rail 110, such that the bridge bar and the pull and push means move back and forth on the guide rail to enable mask replacement, discharge and collection.

The mask supply and collection unit 300 is formed symmetrically to support the new mask NM and the already installed mask M at the supply and discharge positions. As shown in FIGS. 1 to 3 and FIG. 5, the mask supply and collection unit 300 includes a supply and collection body 310, an upper support plate 320, a lower support plate 330, a holding unit 340, and an idler unit 350.

The supply and collection body 310 is formed as a rectangular plate body that extends in an elongate manner in a front and rear longitudinal direction from one end where the mask is supplied and discharged to the printing area. A pair of block holes 312 are formed in a lower portion of a side of an area of the body 310 overlapping the printing area, into which the holding unit 340 described later is retractably coupled. The idler unit 350 described later is retractably coupled to an idler hole 314 formed in a lower portion of a side of an area of the body 310 disposed between the block holes 312.

The new mask NM is mounted on the upper support plate 320. Both left and right ends of the new mask NM to be mounted is caught on the upper surface of one side of the upper support plate 320. The upper support plate 320 extends in an elongate manner in the front-to-back longitudinal direction until the idler hole before the printing area of the screen printer.

The already installed mask M is caught at both left and right ends thereof on the lower support plate 330 so that a position of the mask M is fixed by the holding unit in the printing area of the screen printer, and then, when the new mask NM is input, the already installed mask M is transported from the printing area to the discharge location and is supported on the lower support plate 330. The lower support plate 330 is directly positioned under the upper support plate 320, and extends in an elongate manner in the front and rear longitudinal direction from the printing area of the screen printer to the position where the mask is discharged and collected so that both left and right ends of the already installed mask M to be discharged are caught and supported thereon.

The holding unit 340 may press the left and right sides of the mask NM so that the newly inserted mask NM is caught and supported on the lower support plate 320 in the printing area, and may be retractable to remove the pressure thereon during the discharge and collection of the mask M. The holding unit 340 may be inserted to the block hole 312 of the supply and collection body 310 and may be inserted toward or removed from inner sides of the supply and collection bodies facing each other. The holding unit 340 may be disposed at at least one of the both opposing collection bodies so as to fixedly press the left and right edges of the new mask NM which has moved downwardly from the upper support plate to the lower support plate and then mounted on the printing area under the operation of the vertically-moving unit 400 to prevent movement of the new mask NM disposed on the printing area.

The holding unit 340 may include a rectangular pressing block 342 which is inserted into or removed from the block hole 312 of the supply and collection body 310 so as to be contact or non-contact the inner sides of the supply and collection bodies facing each other. The holding unit 340 may include a pressing cylinder 344 coupled to the outer sides of the supply and collection bodies 310 facing each other, so that a rod thereof is coupled to the pressing block 342. Thus, as the rod moves, the pressing block 342 may move horizontally retractably to the left and right edges of the mask from the block hole 312. That is, after the new mask M is supplied from the upper support plate 320 and transferred downwardly to the lower support plate 330 under the operation of the vertically-moving unit described later, and then the mask is positioned toward the printing area of the screen printer according to the operation of the push cylinder of the pull and push unit, and then the rod horizontally moving under the operation of the pressing cylinder 344 may push the pressing block 342 retractably installed in the block hole of the supply and collection body toward the left and right edges of the mask and pressurizes and fix the pressing block. Thus, the newly mounted mask is positioned in the correct position without leaving the printing area so that screen printing may be performed smoothly.

The idler unit 350 may be inserted onto or removed from the lower surface of the left and right edges of the mask to perform temporary support of the new mask MN thereon for downward transport when the new mask NM is inserted onto the upper support plate and moves along the upper support plate under the operation of the pull and push unit 200, and then is positioned in a space on top of the printing area. The idler unit 350 is coupled to the idler hole 314 of the supply and collection body 310. When the new mask NM to be mounted is positioned from the upper support plate 320 to the printing area by the pull and push unit 200, the idler unit 350 extends from the idler hole 314 inwardly of the inner side of the body 310 such that the new mask is supported on the idler unit 350 at a point beyond the upper support plate, and then is moved. When the new mask NM is moved downward toward the lower support plate 330 under the operation of the vertically-moving unit 400, the idler unit 350 is configured to be inserted into the idler hole 314 to prevent interference with the new mask NM.

The idler unit 350 may include a plurality of idlers 352 that are coupled to a shaft and freely roll to ensure smooth transport of the mask via a rolling motion while the left and right lower surfaces of the mask are supported thereon. The plurality of idlers 352 may be arranged horizontally along a rectangular shaft block 354 corresponding to the idler hole and may be coupled thereto. A rod is coupled to the shaft block 354 to which the plurality of idlers are connected at one side of the shaft block 354. According to the operation of the rod, the plurality of idlers are moved horizontally and are retractable into or extendable from the idler hole 314 toward or from the lower surface of the left and right edges of the mask.

Therefore, the idler unit 350 is configured to support the lower surfaces of the left and right edges of the mask at the end position of the upper support plate until the mask reaches the position at which the mask vertically descends from the upper support plate to the lower support plate. After the mask reaches the position at which the mask vertically descends to the lower support plate, the shaft block having the multiple idlers is inserted into the idler hole to allow the mask to descend vertically without interference with the idler unit when the mask descends vertically to the lower support plate under the operation of the vertically-moving unit 400.

The new mask NM to be mounted is supplied to the upper support plate, then transferred to the printing area by the pull and push unit, and then the vertically-moving unit 400 moves down the new mask on the lower support plate so as be positioned correctly on the printing area. The vertically-moving units 400 are disposed in front of the mask supply and collection unit 300 and are symmetrically arranged so as to face each other and are disposed inwardly of the base plate 100. The mask M already installed in the printing area caught and supported on the lower support plate of the mask supply and collection unit 300 is pushed to the discharged and collected position along the lower support plate under the operation of the pull and push unit 200. When the new mask NM to be mounted supplied from the upper support plate has been pulled and placed onto the printing area of the screen printer under the operation of the pull and push unit 200, the vertically-moving unit 400 moves downwardly the new mask NM, such that both left and right ends of the new mask NM are caught on the lower support plate and positioned in the printing area.

As shown in FIGS. 1 to 3 and FIG. 6, the vertically-moving unit 400 includes a fixing bracket 410, a vertically-moving cylinder 420, a vertically-moving fixing piece 430, an elevating portion 440 and a connecting shaft 450.

The fixing bracket 410 is provided to fix the vertically-moving cylinder 420 which will be described later thereto. When the elevating portion which will be described later moves vertically between the upper support plate and the lower support plate according to the vertical upward operation of the rod of the vertically-moving cylinder, the fixing bracket 410 is in the same vertical level at that of the upper support plate or the lower support plate. Each of the fixing brackets 410 is coupled to each of both opposing sides of the base plate 100 facing each other, and is bent into an "L" shape so that the cylinder is seated thereon and coupled thereto.

The vertically-moving cylinder 420 is configured so that a rod thereof moves vertically, and is seated on the horizontal surface of the bent portion of the fixing bracket 410. In one example, the rod of the vertically-moving cylinder 420 moves step by step so that at a 1-step signal, a vertical level of the elevating portion which will be described later is aligned with that of the upper support plate, and such that a 2-step signal, a vertical level of the elevating portion which will be described later is aligned with that of the lower support plate, or vice versa.

The vertically-moving fixing piece 430 is configured such that the elevating portion 440 vertically moves up and down while being horizontally balanced, under the operation of one vertically-moving cylinder. The vertically-moving fixing piece 430 is formed as a "inverted-T" shaped plate body, and fixing bolt holes 432 are formed therein and are positioned symmetrically in the left and right direction. A rod fixing hole 434 to which the rod of the vertically-moving cylinder 420 is coupled is formed in a surface of the plate protruding from a portion between the fixing bolt holes 432. That is, the upper end of the rod of the vertically-moving cylinder 420 is fixedly coupled to the rod fixing hole 434 of the vertically-moving fixing piece 430, so that when the rod moves vertically, the elevating portion moves vertically while the front and rear sides of the elevating portion, which will be described later are maintained in a level state, and thus the vertical level of the elevating portion is equal to that of the upper support plate or the lower support plate.

When the new mask NM supplied from the upper support plate has been pulled and positioned on the elevating portion 440 under the operation of the pull and push unit, the elevating portion 440 may vertically move the mask to the lower support plate. The elevating portion 440 may move independently under the operation of the vertically-moving cylinder 420 in an area outside an end of the printing area of the mask supply and collection unit 300. The elevating portion 440 moves up such that the vertical level thereof is equal to the vertical level of the upper support plate 320 such that the mask is supported on the elevating portion 440 and the upper support plate 320. The elevating portion 440 moves down such that the vertical level thereof is equal to the vertical level of the lower support plate 330 such that the mask is supported on the elevating portion 440 and the lower support plate 330. That is, as previously described, the elevating portion 440 is coplanar with each of the upper and lower support plates via each of the 1 and 2 step movements of the rod of the vertically-moving cylinder to enable smooth vertical movement of the mask. Furthermore, the elevating portion 440 stably supports the mask transferred thereto while the mask is supported on the idler unit, so that even when the idlers and the shaft block of the idler unit extend from the idler hole and thus the idlers do not support the mask, the mask stably vertically moves without horizontal movement or tilting.

The connecting shaft 450 is designed to connect the elevating portion to the vertically-moving fixing piece such that the elevating portion moves vertically according to the vertical movement of the vertically-moving fixing piece. The upper end of the shaft 450 is fixedly coupled to the fixing bolt hole 432 of the vertically-moving fixing piece 430, and the lower end thereof is coupled to the top of the elevating portion 440, so that the elevating portion moves vertically according to the operation of the vertically-moving cylinder 420, and thus, the mask may be moved to the lower support plate 330.

In one example, as shown in FIG. 11, a spacing-adjustment cylinder 500 may be disposed on the upper side of the mask supply and collection unit 300 and the vertically-moving unit 400 and may prevent upward lifting and horizontal movement for the vertical movement of the new mask NM pulled and supplied by the operation of the pull and push unit 200. Further, the spacing-adjustment cylinder 500 may perform spacing-adjustment during movement according to the height of the mask frame to prevent tilting of the mask when positioning the mask onto the printing area of the mask. That is, the spacing-adjustment cylinder 500 is coupled to the supply and collection body on top of the upper support plate and is formed in a corresponding manner to the thickness of each of the left and right edges of the mask placed on the upper support plate. As the mask is pulled on the upper support plate by the pull and push unit, the spacing-adjustment cylinder 500 may prevent the mask from being lifted upward. The spacing-adjustment cylinder 500 may prevent the mask from being suddenly lifted up at the rear side of the mask at the end of the upper support plate as the mask reaches the printing area and thus prevent the mask from tilting. While the mask has been supplied from the upper support plate before the mask is moved down to the lower support plate, the spacing-adjustment cylinder 500 may maintain the level state of the mask seated on the vertically-moving unit, such that the mask is accurately positioned onto the printing area.

As shown in FIG. 1 to FIG. 3, the mask M with a pattern for solder printing on the printed circuit board is initially installed on the screen printer, and the printed circuit board is produced through the mask M already installed on the printing area using the screen printer S. Then, in order to produce a new printed circuit board, a new mask NM should be mounted. To this end, the automatic mask replacement apparatus for the screen printer according to the present disclosure of the above configuration inputs and seats the new mask NM onto one side of the upper support plate 320 of each of both supply and collection bodies 310 of the mask supply and collection unit 300 facing each other and arranged symmetrically in a left and right direction, as shown in FIG. 1 and FIG. 9.

Next, as shown in FIG. 7 and FIG. 8, the motor shaft rotates according to the operation of the pull and push drive motor 240, and thus the screw shaft 242 coupled to the motor shaft idles. Afterwards, the screw housing 250 coupled to the screw shaft 242 moves back and forth on the axis of the screw shaft under the rotational force of the screw shaft 242. In this regard, while the screw housing 250 moves forward along the screw shaft axis toward the printing area P, the rail block 112 at the bottom of the movable vertical-shaped piece 110 to which the screw housing 250 is fixed moves forward to the front position of the printing area along the guide rail 110. Further, the other movable vertical-shaped piece 110 opposite thereto and coupled to the bridge bar 220 moves forward along the guide rail.

Next, the push cylinder 234 of the pull and push means 230 disposed at the center of the bridge bar 220 of the pull and push unit 200 operates such that the rod thereof contacts the outside of the edge of the already installed mask M fixedly seated on the portion of the lower support plate 330 overlapping the printing area. In order to release the fixation of the mask, the pressing block 342 which is pressing the left and right sides of the mask under the operation of the pressing cylinder 344 of the holding unit 340 is inserted into the block hole 312 of the supply and collection body 310. Thus, the mask is released from the printing area. In this regard, the holding unit 340 may be disposed at one of the supply and collection bodies that face each other and are symmetrical with each other, while the other of the supply and collection bodies may serve as a reference line and may be fixed.

Next, according to the operation of the pull and push drive motor 240, the pull and push unit moves along the guide rail to the rear side of the lower support plate 330 for mask collection. The pull and push unit moves and pushes the mask to the rear of the lower support plate while the rod of the push cylinder 234 is in contact with the outside of the edge of the already installed mask M. Then, the mask may be collected.

Next, as shown in FIG. 9 and FIG. 10. The rod of the push cylinder returns to its original position (a position at which the rod does not interfere with the new mask placed on the upper support plate). The pull cylinder 232 of the pull and push means 230 disposed at the center of the bridge bar 220 of the pull and push unit 200 operates to move the rod downwardly, so that the end of the downwardly moved rod is engaged with the front edge of the new mask NM to be mounted and then, the new mask moves along the upper support plate 320 under the operation of the pull and push drive motor 240. In this regard, the motor shaft rotates according to the operation of the pull and push drive motor 240, and the screw shaft 242 coupled to the motor shaft idles. Afterwards, the screw housing 250 coupled to the screw shaft 242 moves back and forth along the axis of the screw shaft under the rotational force of the screw shaft 242.

Next, when the screw housing 250 moves forward along the screw shaft axis toward the printing area P, the rail block 112 at the bottom of the movable vertical-shaped piece 110 to which the screw housing 250 moves forward to the printing area along the guide rail 110. Further, the other movable vertical-shaped piece 110 opposite thereto and coupled to the bridge bar 220 moves forward along the guide rail. Accordingly, the new mask NM engaged with the rod of the pull cylinder 232 moves toward the printing area along the upper support plate.

Next, the tip of the new mask NM placed on the upper support plate 320 which terminates at a position close to the printing area continues to move to a position of the pull and push unit 200 in front of the printing area. As the mask moves away from the upper support plate 320, the shaft block 354 on which the plurality of idlers 352 of the idler unit 350 is formed protrudes or extends out of the idler hole 314 to support the lower surfaces of the left and right edges of the mask. Therefore, as the idler unit 350 protrudes or extends out of the idler hole 314 so as to support the new mask, the new mask NM continues to move toward the printing area along the same horizontal plane flush with the upper support plate 320 without falling toward the lower support plate 330. The tip of the mask is moved and placed on the elevating portion 440 of the vertically-moving unit 400 coplanar with the upper support plate 320, and the mask is continuously moved while being supported on the elevating portion 440 so that the mask does not fall down while being seated on the elevating portion 440.

Next, the shaft block 354 of the idler unit 350 together with the idler 352 is inserted into the idler hole 314 according to the operation of the support cylinder 356, such that the new mask NM descends smoothly to the lower support plate 330 without interference with the idler unit.

Afterwards, the new mask NM placed on the elevating portion 440 of the vertically-moving unit 400 is lowered to the lower support plate 330. At this time, the vertically-moving cylinder 420 of the vertically-moving unit 400 operates such that the rod thereof moves downward. As the rod moves downward, the vertically-moving fixing piece 430 and the elevating portion 440 connected thereto via the connecting shaft 450 move downward such that the elevating portion 440 is coplanar with the lower support plate 330.

Next, the rod of the pull cylinder 232 of the pull and push unit 200 returns to its original state, such that the pulling operation of the new mask NM is disabled. The rod of the push cylinder 234 moves downward and contacts the outside of the edge of the new mask NM and pushes the mask to the printing area. In this regard, when the new mask NM has been placed on the printing area, the pressing cylinder 344 of the holding unit 340 operates such that the pressing block 342 protrudes or extends from the block hole to press the left and right side edges of the mask. Alternatively, the holding unit 340 may be disposed at one of the supply and collection bodies 310 that face each other and are symmetrical with each other, while the other of the supply and collection bodies 310 at which the holding unit 340 is not disposed may serve as a reference line. In this regard, the pressing cylinder 344 of the holding unit 340 operates such that the pressing block 342 protrudes or extends from the block hole to press the mask toward the reference line.

As mentioned above, as shown in FIG. 11, the spacing-adjustment cylinder 500 may be disposed on the upper side of the mask supply and collection unit 300 and the vertically-moving unit 400 and may prevent upward lifting and horizontal movement for the vertical movement of the new mask NM pulled and supplied by the operation of the pull and push unit 200. Further, the spacing-adjustment cylinder 500 may perform spacing-adjustment during movement according to the height of the mask frame to prevent tilting of the mask when positioning the mask onto the printing area of the mask. Thus, the level state of the mask may be maintained, thereby improving mask alignment and mask input precision. Thus, high quality screen printing may be achieved.

As the mask input and discharge proceed in one direction as described above, the mask replacement time may be significantly shortened compared to a configuration in which the mask input and discharge processes are performed in opposite directions. The mask setting time may be shortened by allowing accurate input and collection of the mask via the input, discharge and collection in one direction.

Further, the automatic mask replacement apparatus operates to automatically replace the already installed mask M with a new mask NM at the same time to shorten the mask replacement time. By simultaneously and automatically replacing the mask in this manner, thereby quickly switching to production of a new printed circuit board without inconvenience of the replacement work due to unnecessary manpower, and thus not only improving productivity and increases efficiency via reduction of a working time, but also minimizing change in a process condition via quick replacement in an automatic process rather than unreasonable replacement, thereby minimizing occurrence of product defects due to the replacement work.

Furthermore, the conventional mask replacement apparatus is installed on one side of the screen printer. However, the mask replacement apparatus according to the present disclosure is located on top of the printing area of the screen printer, such that a separate installation area is not required, and thus, there are no restrictions on installation. Further, only the automatic mask replacement apparatus may be installed without changing the existing production line, such that the apparatus may be additionally installed on the existing facility line, and the apparatus may be generally used, and an installation cost thereof may be reduced.

Although the specific embodiments are described above in the detailed description of the present disclosure, those skilled in the art appreciate that various modifications may be made thereto without deviating from the scope of the present disclosure. The modifications are within the scope of the claims.

| Reference numerals | |
|---|---|
| M: mask | NM: new mask |
| S: screen printer | P: printing area |
| 100: base plate | |
| 110: guide rail | 200: pull and push unit |
| 210: movable vertical-shaped piece | 212: rail block |
| 220: bridge bar | 230: pull and push means |
| 232: pull cylinder | 234: push cylinder |
| 240: pull and push drive motor | 242: screw shaft |
| 250: screw housing | 300: mask supply and collection unit |
| 310: supply and collection body | 312: block hole |
| 314: idler hole | 320: upper support plate |
| 330: lower support plate | 340: holding unit |
| 342: pressing block | 344: pressing cylinder |
| 350: idler unit | 352: idler |
| 354: shaft block | 356: support cylinder |
| 400: vertically-moving unit | 410: fixing bracket |
| 420: vertically-moving cylinder | 430: vertically-moving fixing piece |
| 432: fixing bolt hole | 434: rod fixing hole |

| Reference numerals | |
|---|---|
| 440: elevating portion | 450: connection shaft |
| 500: spacing-adjustment cylinder | |

The invention claimed is:

1. An automatic mask replacement apparatus for a screen printer S, wherein the automatic mask replacement apparatus is coupled to one side of a printing area P of the screen printer S and automatically replaces a mask M mounted on a top of the printing area, wherein the automatic mask replacement apparatus comprises:

a base plate 100 having both guide rails 110 installed on an upper surface thereof and extending in an elongate manner in a front-to-back longitudinal direction, wherein the both guide rails 110 are arranged symmetrically in a left and right direction and are disposed on top of the printing area of the screen printer;

a pull and push unit 200 coupled to the guide rails 110 of the base plate 100 and configured to move back and forth along the guide rails under an operation of a pull and push drive motor so as to push and discharge a mask M already installed on the printing area P of the screen printer S and to pull and insert a new mask NM to be mounted onto the printing area P of the screen printer S;

both mask supply and collection units 300 symmetrically formed in a left and right direction so as to face each other and respectively disposed at opposing inner left and right surfaces of the base plate 100, wherein each of the both mask supply and collection units 300 has an upper support plate extending to the printing area of the screen printer in an elongate manner in a front-to-back longitudinal direction, wherein each of left and right ends of the new mask NM is caught and supported on an upper surface of the upper support plate, wherein the each of the both mask supply and collection units 300 has a lower support plate positioned directly under the upper support plate and extending in an elongate manner in a front and rear direction from the printing area of the screen printer to a position where the mask M is discharged and collected, wherein each of left and right ends of the already installed mask M being discharged is caught and supported on an upper surface of the lower support plate; and both vertically-moving units 400 arranged symmetrically formed in the right and left direction so as to face each other and positioned in front of the mask supply and collection unit 300 and inwardly of the base plate 100, wherein the mask M already installed on the printing area and caught and supported on the lower support plate of the mask supply and collection unit 300 is pushed on and along the lower support plate to a discharge collection position under an operation of the pull and push unit 200, and then, the new mask NM to be mounted into the printing area supplied from the upper support plate is pulled and positioned to the printing area under an operation of the pull and push unit, and then each of the vertically-moving unit 400 moves down the new mask NM on the lower support plate such that each of both left and right ends of the new mask NM are caught and supported on the lower support plate and positioned on the printing area, wherein the pull and push unit 200 includes:

each of both movable vertical-shaped pieces 210 having a rail block 212 disposed at a low end thereof such that the rail block 212 is rail-coupled to each of the guide rails 110 of the base plate 100;

a plate-shaped bridge bar 220 having both opposing ends, wherein each of the movable vertical-shaped pieces 110 is coupled to a lower side of each of the both opposing ends of the plate-shaped bridge bar 220, wherein when the plate-shaped bridge bar 220 move in a back and forth direction of the base plate, the movable vertical-shaped piece coupled thereto moves in the back and forth direction along the guide rail;

a pull and push means 230 disposed at a center of the bridge bar 220, and including a pull cylinder 232 configured to pull the new mask NM toward the printing area and a push cylinder 234 configured to push the mask M already installed in the printing area so that the mask M is discharged and collected;

a pull and push drive motor 240 coupled to one side of an upper surface of the base plate 100 and having a screw shaft 242 extending along an axis of a motor shaft in the front and rear longitudinal direction in an elongate manner to the printing area; and a screw housing 250 coupled to an outer side of one of the both movable vertical-shaped pieces 210, and screw-coupled to the screw shaft 242 of the pull and push drive motor 240 so as to convert a rotation motion of the screw shaft into a linear motion so that each of the movable vertical-shaped pieces 210 moves back and forth on the guide rail 110.

2. The automatic mask replacement apparatus for the screen printer of claim 1, wherein each of the both mask supply and collection units 300 includes:

a supply and collection body 310 formed as a rectangular plate body extending in an elongate manner in a front and rear longitudinal direction from one end where the mask is supplied and discharged to the printing area, wherein a pair of block holes 312 are formed in a lower portion of a side of an area of the body 310 overlapping the printing area, wherein an idler hole 314 is formed in a lower portion of a side of an area of the body 310 disposed between the block holes 312;

the upper support plate 320 disposed on an upper level of an inner side surface of the supply and collection body 310 and extending in an elongate manner in the front-to-back longitudinal direction until the idler hole before the printing area of the screen printer, wherein each of both left and right ends of the new mask NM is caught and supported on an upper surface of the upper support plate 320;

the lower support plate 330 disposed on a lower level of the inner side surface of the supply and collection body 310 and directly positioned under the upper support plate 320, and extending in an elongate manner in the front and rear longitudinal direction from the printing area of the screen printer to the position where the mask is discharged and collected so that each of both left and right ends of the already installed mask M to be discharged are caught and supported on an upper surface thereof;

a holding unit 340 retractable into or extendable from the block hole 312 of the supply and collection body 310 so as to contact or non-contact each of inner sides of the supply and collection bodies facing each other, wherein the holding unit 340 is disposed at at least one of the both opposing collection bodies so as to press and fix each of left and right edges of the new mask NM having moved downwardly from the upper support plate to the lower support plate and then mounted on the printing area under an operation of the vertically-moving unit 400 to prevent horizontal movement of the new mask NM; and an idler unit 350 retractable into or extendable from the idler hole 314 of the supply and collection body 310, wherein when the new mask NM is displaced from the upper support plate 320 to the printing area under the operation of the pull and push unit 200, the idler unit 350 is configured to extend from the idler hole 314 inwardly of the inner side of the body 310 such that the new mask is supported on the idler unit 350 at a point beyond the upper support plate, and then the new mask is moved, wherein when the new mask NM is displaced downward toward the lower support plate 330 under the operation of the vertically-moving unit 400, the idler unit 350 is configured to be retractable into the idler hole 314 to prevent interference with the new mask NM.

3. The automatic mask replacement apparatus for the screen printer of claim 2, wherein the holding unit 340 includes:

a rectangular pressing block 342 retractable into or extendable from the block hole 312 of the supply and collection body 310 so as to be contact or non-contact each of the inner sides of the supply and collection bodies facing each other; and a pressing cylinder 344 coupled to each of outer sides of the supply and collection bodies 310 facing each other, so that a rod thereof is coupled to the pressing block 342, wherein as the rod horizontally moves, the pressing block 342 moves horizontally so as to be retractable into or extendable from the block hole 312.

4. The automatic mask replacement apparatus for the screen printer of claim 2, wherein the idler unit 350 includes:

a plurality of idlers 352 respectively coupled to shafts so as to freely roll around the shafts;

a shaft block 354 to which the shafts coupled to plurality of idlers 352 are coupled; and a support cylinder 356 having a rod coupled to the shaft block 354 to which the plurality of idlers are coupled, wherein as the rod moves, the plurality of idlers are moved horizontally so as to be retractable into or extendable from the idler hole 314.

5. The automatic mask replacement apparatus for the screen printer of claim 2, wherein each of the vertically-moving units 400 includes:

a fixing bracket 410 coupled to each of both opposing sides of the base plate 100 facing each other, and bent into an "L" shape so that a cylinder is seated thereon and coupled thereto;

a vertically-moving cylinder 420 having a movable vertically rod, where the vertically-moving cylinder 420 is seated on a horizontal surface of a bent portion of the fixing bracket 410;

a vertically-moving fixing piece 430 formed as a "inverted-T" shaped plate body, wherein fixing bolt holes 432 are formed therein and are positioned symmetrically in the left and right direction, wherein a rod fixing hole 434 to which the rod of the vertically-moving cylinder 420 is coupled is formed in a surface of a plate protruding from a portion between the fixing bolt holes 432;

an elevating portion 440 moving independently in an area of the mask supply and collection unit 300 outside an end of the printing area under the operation of the vertically-moving cylinder 420, wherein the elevating portion 440 moves up such that a vertical level thereof is equal to a vertical level of the upper support plate 320 such that the mask is supported on the elevating portion 440 and the upper support plate 320, wherein the elevating portion 440 moves down such that the vertical level thereof is equal to a vertical level of the lower support plate 330 such that the mask is supported on the elevating portion 440 and the lower support plate 330; and a connecting shaft 450 having an upper end fixedly coupled to the fixing bolt hole 432 of the vertically-moving fixing piece 430, and a lower end coupled to a top of the elevating portion 440, so that the elevating portion moves vertically under the operation of the vertically-moving cylinder 420 and thus, the mask placed thereon is displaced to the lower support plate 330.

6. The automatic mask replacement apparatus for the screen printer of claim 1, wherein the automatic mask replacement apparatus further comprises a spacing-adjustment cylinder 500 disposed on an upper side of each of the mask supply and collection unit 300 and the vertically-moving unit 400 to prevent upward lifting and horizontal movement for the vertical movement of the new mask NM pulled and supplied under the operation of the pull and push unit 200, wherein the spacing-adjustment cylinder 500 is configured to perform spacing-adjustment during movement according to a height of the mask frame to prevent tilting of the mask when positioning the mask onto the printing area of the mask.

* * * * *